(12) United States Patent
Bock

(10) Patent No.: US 10,354,840 B2
(45) Date of Patent: Jul. 16, 2019

(54) CONTROL ARRANGEMENT, CONTROL SYSTEM AND HIGH FREQUENCY POWER GENERATING DEVICE

(71) Applicant: TRUMPF Huettinger GmbH + Co. KG, Freiburg (DE)

(72) Inventor: Christian Bock, Freiburg (DE)

(73) Assignee: TRUMPF Heuttinger GmbH + Co. KG, Freiburg (DE)

( * ) Notice: Subject to any disclaimer, the term of this patent is extended or adjusted under 35 U.S.C. 154(b) by 133 days.

(21) Appl. No.: 15/355,330

(22) Filed: Nov. 18, 2016

(65) Prior Publication Data

US 2017/0069465 A1    Mar. 9, 2017

Related U.S. Application Data

(63) Continuation of application No. PCT/EP2015/060853, filed on May 18, 2015.

(30) Foreign Application Priority Data

May 19, 2014    (DE) .................. 10 2014 209 469

(51) Int. Cl.
*H03H 7/40*    (2006.01)
*H05H 1/46*    (2006.01)
(Continued)

(52) U.S. Cl.
CPC ........ *H01J 37/32183* (2013.01); *G05B 11/06* (2013.01); *H03H 7/40* (2013.01); *H05H 1/46* (2013.01)

(58) Field of Classification Search
None
See application file for complete search history.

(56) References Cited

U.S. PATENT DOCUMENTS 6,259,210 B1 *  7/2001  Wells .................. H01J 27/022
                                          250/423 R
7,477,711 B2 *  1/2009  Kalvaitis .......... H01J 37/32082
                                          375/147
(Continued)

FOREIGN PATENT DOCUMENTS

CN    1586043 A    2/2005
CN    100361398 C    1/2008
(Continued)

OTHER PUBLICATIONS

International Search Report from corresponding PCT Application No. PCT/EP2015/060853, dated Oct. 1, 2015, 4 pages.
(Continued)

*Primary Examiner* — Dion Ferguson
*Assistant Examiner* — Srinivas Sathiraju
(74) *Attorney, Agent, or Firm* — Fish & Richardson P.C.

(57) ABSTRACT

Techniques are described for controlling the power and/or matching the impedance of the output impedance of a high frequency power generator to the impedance of a load, in particular a plasma discharge. A control arrangement may include a control unit, to which a target value, an actual value, and a correction value is supplied, the control unit being set up to generate an adjustment value by taking into account the correction value. The control arrangement may also include a device for determining the correction value, to which a control value is supplied and which is set up to determine the correction value by taking into account the control value and a default value. In some embodiments, when the control value deviates from the default value, the correction value influences the control unit such that the actual value deviates from the target value in the adjusted state of the control unit.

20 Claims, 7 Drawing Sheets

(51) Int. Cl.
*G05B 11/06* (2006.01)
*H01J 37/32* (2006.01)

(56) References Cited

U.S. PATENT DOCUMENTS

| | | | |
|---|---|---|---|
| 7,755,300 B2* | 7/2010 | Kishinevsky | H01J 37/32082 315/209 R |
| 8,395,322 B2* | 3/2013 | Coumou | H01J 37/32082 315/111.21 |
| 8,576,013 B2 | 11/2013 | Coumou | |
| 8,980,044 B2* | 3/2015 | Brillhart | H01L 21/67109 118/666 |
| 9,805,916 B2* | 10/2017 | Konno | H01J 37/32165 |
| 2005/0093459 A1* | 5/2005 | Kishinevsky | H01J 37/32082 315/111.21 |
| 2006/0220656 A1 | 10/2006 | Tanaka et al. | |
| 2007/0188365 A1* | 8/2007 | Bock | H03M 1/1052 341/155 |
| 2008/0056412 A1* | 3/2008 | Bock | H04L 25/067 375/341 |
| 2008/0112509 A1* | 5/2008 | Bock | H04L 7/0054 375/320 |
| 2008/0158927 A1 | 7/2008 | Omae et al. | |
| 2008/0225973 A1* | 9/2008 | Bock | H04L 27/0012 375/261 |
| 2010/0270141 A1* | 10/2010 | Carter | H01J 37/32935 204/164 |
| 2012/0013253 A1* | 1/2012 | Coumou | H01J 37/32082 315/111.21 |
| 2013/0169359 A1* | 7/2013 | Coumou | H03F 3/191 330/192 |
| 2014/0055034 A1* | 2/2014 | Coumou | H01J 37/32082 315/111.21 |
| 2015/0000843 A1* | 1/2015 | Koshiishi | H01J 37/32027 156/345.28 |

FOREIGN PATENT DOCUMENTS

| | | |
|---|---|---|
| CN | 101197461 A | 6/2008 |
| CN | 101277578 A | 10/2008 |
| CN | 101374381 A | 2/2009 |
| CN | 101754566 A | 6/2010 |
| CN | 101754570 A | 6/2010 |
| CN | 201601886 U | 10/2010 |
| CN | 101896034 A | 11/2010 |
| CN | 101989524 A | 3/2011 |
| CN | 103312293 A | 9/2013 |
| CN | 103444089 A | 12/2013 |
| CN | 103687267 A | 3/2014 |
| DE | 69213194 T2 | 1/1997 |
| DE | 102010002121 B3 | 7/2011 |
| DE | 102011076404 A1 | 11/2012 |
| EP | 2528240 A1 | 11/2012 |
| JP | 2006-286254 | 10/2006 |
| JP | 2006-310245 | 11/2006 |
| JP | 2008-181846 | 8/2008 |
| JP | 2013-153432 | 8/2013 |
| JP | 2014-072807 | 4/2014 |
| WO | WO 03043207 | 5/2003 |
| WO | WO2012159620 A2 | 11/2012 |

OTHER PUBLICATIONS

Office Action in Chinese Application No. 201580032851.7, dated Dec. 17, 2018, 9 pages (with English tmnslation).
Office Action in Japanese Application No. 2016-568636, dated Dec. 3, 2018. 24 pages (with English tmnslation).

* cited by examiner

CONTROL ARRANGEMENT, CONTROL SYSTEM AND HIGH FREQUENCY POWER GENERATING DEVICE

CROSS-REFERENCE TO RELATED APPLICATIONS

This application is a continuation of and claims priority under 35 U.S.C. § 120 to PCT Application No. PCT/EP2015/060853 filed on May 18, 2015, which claims priority to German Application No. DE 10 2014 209 469.0, filed on May 19, 2014. The entire contents of these priority applications are incorporated herein by reference.

TECHNICAL FIELD

This disclosure is related to power control and impedance matching in power generation systems.

BACKGROUND

In industrial high frequency (HF) plasma technology, matching the electrical impedance of the high frequency power source (e.g., a high frequency power generator) to the consumer, in particular a plasma discharge, is an important detail. Normally, a matching circuit undertakes this task. In the process, electrical reactances form a transformation circuit, which transforms the complex impedance of the load (often very low-ohm) into that of the high frequency power generator (normally $(50+0j)\Omega$). Known embodiments are circuits consisting of two capacitors and one coil.

Since the impedance of the consumer (the load) is constantly changing as a result of the inconsistent property of the plasma, matching circuits are provided with a control, which normally readjusts two of the three reactances such that the impedance detected by the high frequency power generator remains constant.

Matching circuits have the disadvantage, however, that their variable reactances—often stepper-motor-controlled rotary vacuum capacitors for higher high frequency power—can only be readjusted slowly (in the millisecond to second range) and, moreover, are subject to wear.

To be able to react on a faster timescale (micro to millisecond), control of the excitation frequency of the high frequency power generator has established itself in the industrial use of plasma. In the process, the frequency of the fundamental wave (synonymous with fundamental frequency) (normally from 2 MHz to 160 MHz) changes such that improved matching of the impedance of the high frequency power generator to the load emerges.

One disadvantage of frequency control is the limited scope of influence as a result of low dependence of the impedance on the frequency and the often limited frequency range of the high frequency power generator. A further disadvantage of frequency control is the inherent impossibility of being able to balance every impedance value of the load since the frequency axis is only a one-dimensional value, but two linearly independent parameters are required for transformation of a complex and therefore two-dimensional impedance.

For these reasons, a controlled matching circuit is usually required in addition. While the frequency control balances the rapid plasma changes, a matching circuit can transform a wide, two-dimensional impedance range and therefore undertake the basic impedance matching.

The use of two independent controls is complicated. At best, the overall gain of the two control circuits forms a plateau, the controls remain stable at each found position. Even low tolerances such as offset voltages or rounding errors in digital intermediate calculations can lead to the controls building each other up, which is often stopped only by reaching a control limit. For example, the readjustment of the frequency can lead to the matching circuit adjusting its reactances which in turn leads to a renewed readjustment of the frequency, etc. until one of the reactances cannot be readjusted any further or the limit of the frequency range is reached. It is therefore difficult to reach a stable state for the impedance matching.

SUMMARY

This disclosure describes embodiments of a control arrangement for controlling the power and/or matching the impedance of the output impedance of a high frequency power generator to the impedance of a load, in particular a plasma discharge. In some embodiments, the control arrangement includes a first control unit, to which a first target value and a first actual value and a correction value are supplied, the first control unit being set up to generate a first adjustment value by taking into account the correction value. The control arrangement may also include a device for determining the correction value, to which a control value is supplied and which is set up to determine the correction value by taking into account the control value and a default value. Embodiments also include a control system, a high frequency power generating device having a high frequency power generator, a plasma excitation system and a method, in particular for controlling the power and/or matching the impedance of the output impedance of a high frequency power generator to the impedance of a load.

An object of one or more embodiments of the present invention is to demonstrate a possibility for impedance matching with which a stable impedance matching state can be achieved.

According to a first aspect, the object is achieved by a control arrangement, in particular for controlling power and/or matching the impedance of the output impedance of a high frequency power generator to the impedance of a load, in particular a plasma discharge, the control arrangement comprising:

a. a first control unit, to which a first target value and a first actual value and a correction value are supplied, the first control unit being set up to generate a first adjustment value by taking into account the correction value, b. a device for determining the correction value, to which a control value is supplied and which is set up to determine the correction value by taking into account the control value and a default value, c. the device for determining the correction value and the first control unit being designed such that, when the control value deviates from the default value, the correction value influences the first control unit such that the first actual value deviates from the first target value in the adjusted state of the first control unit.

It is provided accordingly for a control to be designed not, as is usually the case, such that a first adjustment value is generated so that the measured actual value is equivalent to the target value in the adjusted state, but rather a deviation between the actual value and the target value is brought about intentionally. For example, the power $P_r$ reflected by a consumer, for example a plasma discharge, can be detected as the first target value. This reflected power may be as low as possible. Therefore, a reflected power of 0 W, for example, can be specified as the first target value.

To match the impedance, it can be provided for the fundamental frequency to be varied. The first adjustment value is accordingly generated in such a way that the fundamental frequency is adjusted such that a reflected power of 0 W is not exactly achieved. This occurs in that in the device for determining the correction value, a corresponding correction value is generated which is taken into account when determining the first adjustment value. For this purpose, the first adjustment value itself, for example, can be supplied as the control value. Another variable dependent on the adjustment value can, however, also be supplied as the control value to the device for determining the correction value. This can, for example, be the measured frequency adjusted by the adjustment value. It can also be a variable which is influenced by the adjustment value in the matching circuit, for example the adjustment of a reactance, in particular a capacitance, in the matching circuit. In the process, the adjustment value can be an adjustment value for the matching circuit, in particular for a reactance in the matching circuit. It is, however, also possible for the first adjustment value to be a default value for adjusting frequency and to likewise influence the matching circuit, in particular the reactance, indirectly as a result of its effect on the frequency. The control value can therefore be the first adjustment value or a variable that is directly or indirectly influenced by the first adjustment value.

Because the actual value is frequently also influenced by a second control arrangement, for example a control arrangement which controls a matching circuit, the above-described procedure means that it is possible for stable impedance matching to be achieved overall.

As a result of the control arrangement, the frequency of the high frequency power generator is therefore not matched to a minimal control deviation but has a tendency towards the preferred frequency (default value), and so as a result of this intentional minor mismatch, the control unit of the matching circuit may always have an incentive likewise to control until ultimately the current frequency matches the preferred frequency again.

As already mentioned above, the correction value can be the first adjustment value.

The correction value can also be a determined actual value, which adjusts itself depending on the first adjustment value.

The first adjustment value can be an adjustment value for the frequency of the high frequency power generator.

The first adjustment value can be an adjustment value for a variable of a component, in particular a reactance, preferably a capacitance of a matching circuit.

The correction value can be a determined frequency of the high frequency power generator.

In particular, the device for determining the correction value and the first control unit can be designed such that, when the control value deviates from the default value, the correction value influences the first control unit such that the first actual value deviates from the first target value in the adjusted state of the first control unit as a result of the influence of the correction value. In particular, the first target value can be modified in the adjusted state of the first control unit by the influence of the correction value.

The correction value can be a determined variable or an adjustment value of the second control arrangement for this variable. In the process, this can be the variable of a component, in particular a reactance, preferably a capacitance, of the matching circuit.

In the process, the correction value can also depend on the first adjustment value in an indirect manner. The first adjustment value can, for example, be an adjustment value for the frequency of the high frequency power generator and the correction value can be a determined variable or an adjustment value of the second control arrangement for this variable. In the process, this can be the variable of a component, in particular a reactance, preferably a capacitance, of the matching circuit.

The control arrangement can also provide advantages without the presence of an above-described second control arrangement. That is to say, an improvement in efficiency can also be achieved by the control arrangement per se. The high frequency power generator can allow reflected power and therefore work in a frequency range in which it works much more efficiently such that the losses as a result of the reflected power are more than compensated for.

Furthermore, stabilization of the control of the impedance matching occurs, in particular, if a further control of an external matching circuit influences the internal control (of the frequency).

The device for determining the correction value can be set up to determine the correction value such that a deviation of the correction value from the default value is reduced. For example, a fundamental frequency can be specified as the default value and the detected current fundamental frequency of the high frequency power generator can be used as the correction value. The device for determining the correction value therefore attempts to reduce the deviation of the current fundamental frequency from the default fundamental frequency. As a result of this, the adjusted fundamental frequency can be prevented from reaching beyond a permitted frequency range. A single frequency can be used as the default value. A frequency range can also be used.

Instead of using a frequency as the default value, it is also possible to specify a reactance of a matching circuit as the default value or the setting of a capacitor of a matching circuit.

The first adjustment value can be used to adjust the matching circuit and a reactance of the same in order to achieve a deviation of the first actual value, for example a reflected power, from the target value in a targeted manner.

The control value can correspond to a current detected reactance of the matching circuit.

The control unit can comprise an, in particular digital, integrator.

The correction value can be added to the integral component of the integrator or multiplied thereby. In particular, the correction value can be added or multiplied in a feedback loop of the integrator. In the process, the correction value can be 0 (zero) if the control value is equivalent to the default value, when, for example, the detected fundamental frequency or the adjustment value for the fundamental frequency is equivalent to the default frequency. The correction value may be all the more negative when the difference "control value minus default value" is greater.

The correction value may be all the more positive when the difference "default value minus control value" is greater.

If a multiplication is carried out, the integrator can be influenced constantly such that the control prefers the direction of the default value, therefore for example of the specified frequency. For example, in the event of a positive deviation, the content of the integrator is constantly reduced slightly; in the event of a negative frequency deviation, the content of the integrator is constantly increased slightly.

The control unit can comprise a proportional controller, to which the correction value is supplied. The correction value can thus reduce the deviation from the first actual value and first target value the more the current frequency deviates absolutely from the preferred or specified frequency.

The correction value can be a function, in particular a linear or quadratic function or any other desired function of the deviation from both the default value and the control value.

The device for determining the correction value can be designed as a further control unit, the correction value being a further adjustment value, the default value being a further target value and the correction value being a further actual value. For example, the further control unit can be provided to control a frequency. Alternatively, the further control unit can be designed to control a component, in particular a reactance of a matching circuit, also called a matchbox.

A control unit, which actuates the device for determining the correction value and/or the first control unit, can be provided. For example, the control unit can intervene in order to bring a frequency deviation from a desired fundamental frequency into a desired range.

Moreover, a control system comprising a first control arrangement according to the invention and comprising a second control arrangement falls within the scope of the invention. The first actual value or an actual variable related thereto can be supplied to the second control arrangement, the second control arrangement being set up to generate a second adjustment value. For example, the first control arrangement can be provided to control the reflected power at the output of the high frequency power generator, the first control unit being provided for this purpose. The further control unit, i.e. the device for determining the correction value, can be provided to control the fundamental frequency. The second control arrangement can be provided likewise to control the reflected power at the output of the high frequency power generator or a related variable. In particular, an external matching circuit can be provided that detects a reflected power or another variable related thereto using a separate measuring device. This variable can be controlled in that a component, in particular a reactance, preferably a capacitor, of the matching circuit is adjusted and controlled.

The second adjustment value is provided in order to adjust the components accordingly.

It is, of course, also possible to control a component, in particular a reactance, preferably a capacitor, of a matching circuit using the first control arrangement and to control the excitation frequency and fundamental frequency of the high frequency power generator using the second control arrangement.

Furthermore, a high frequency generating device comprising a high frequency power generator and a measuring device for determining the first actual value and comprising a control arrangement may also be provided, according to one or more embodiments.

In the process, it can be provided for the first adjustment value to influence the frequency of the high frequency power generator.

Moreover, a high frequency generating device comprising a high frequency power generator and a measuring device for determining the first actual value and comprising a control system may also be provided according to one or more embodiments.

At least some embodiments include a plasma excitation system having a high frequency power generator, a plasma discharge, which is connected to the high frequency power generator such that it can be supplied with the power generated by the high frequency power generator, and a measuring device for determining the first actual value and comprising a control arrangement according to the invention.

At least some embodiments include a plasma excitation system having a high frequency power generator, a plasma discharge, which is connected to the high frequency power generator so that it can be supplied with the power generated by the high frequency power generator, and a measuring device for determining the first actual value and a control system.

At least some embodiments include a method, in particular for controlling the output and/or matching the impedance of the output of a high frequency power generator to the impedance of a load, in particular of a plasma discharge, comprising the method steps of:

a. generating a first adjustment value of a first control unit from a first target value, a first actual value and a correction value, b. determining a correction value from a control value and a default value, c. the correction value being generated such that, when the control value deviates from the default value, the first actual value deviates from the first target value in the adjusted state of the first control unit.

As a result of this procedure, the adjustment of the impedance matching is stabilized.

Alternatively, or additionally, it can be provided for the first adjustment value to be monitored by a control means and for the correction value to be determined with reference to the first adjustment value.

Furthermore, it can be provided for the generation of a first adjustment value and the determination of a correction value to be carried out in a first control arrangement and the first actual value or a value related thereto to be controlled furthermore by a second control arrangement. In the process, the control direction in both control arrangements can be determined consensually (simultaneously). In the case of the consensual control, it can be provided in particular for the first control unit of the first control arrangement to comprise a device for determining the control deviation, to which the first actual value and the first target value are supplied and which is set up to determine a control deviation from the first actual value and the first target value, which control deviation is taken into account in the determination of the first adjustment value.

Alternatively, the control direction may be determined consecutively, i.e. using trial and error. In the case of consecutive control, no magnitude of error needs to be determined simultaneously in terms of amount and sign, but rather the control direction of the frequency or reactance respectively is determined using trial and error (better/worse match). For example, frequency detuning away from the frequency for optimal matching towards the preferred frequency can occur until a tolerable mismatch for this frequency offset is reached. The direction is defined from the rise in the match curve determined by the step-by-step attempts.

If the first control arrangement is used to adjust the reactance of a matching circuit, preferably the reactance of the matching circuit, of which the setting depends more on the fundamental frequency, is manipulated.

In particular, when the control value deviates from the default value, the first actual value can deviate from the first target value in the adjusted state of the first control unit as a result of the influence of the correction value. In particular, in the adjusted state of the first control unit, the first actual value can be modified by the influence of the correction value.

Further features and advantages of various embodiments of the invention can be found from the following detailed description of the various embodiments, with reference to the drawings which show details of the embodiments, and from the claims. The features shown there are not necessarily to be interpreted as being to scale and are shown such that the characteristics according to the various embodiments can be made clearly visible. The various features can each be implemented individually per se or in pluralities in any desired combination in variations of the embodiments.

DETAILED DESCRIPTION

Figure 1A:
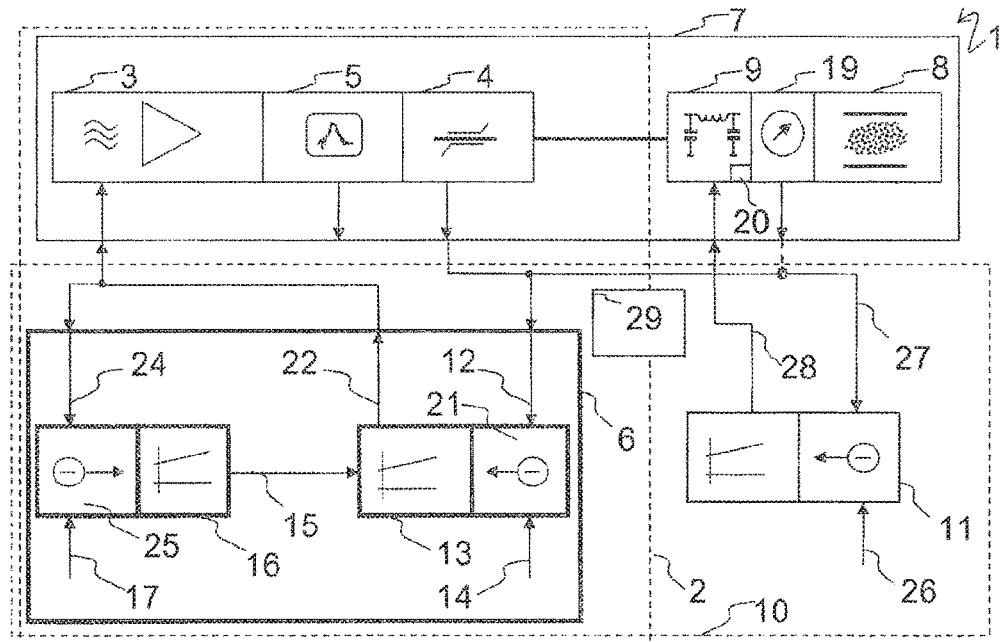
FIGS. 1A, 1B, 1C and 1D depict embodiments of a plasma excitation system shown schematically.

FIGS. 1A to 1D show four first embodiments of a plasma excitation system 1 having a high frequency generating device 2, which comprises a high frequency power generator 3, a first measuring device 4 and a second measuring device 5 as well as a first control arrangement 6. Moreover, the high frequency power generator 3, the first and second measuring devices 4, 5 are part of a high frequency gas discharge device 7, which comprises a plasma chamber 8, a matching circuit 9 and a third measuring device 20.

Furthermore, FIGS. 1A to 1D each show a control system 10, which, in addition to the first control arrangement 6, has a second control arrangement 11. In the process, the first control arrangement 6 controls the high frequency power generator 3, in particular the frequency of the high frequency power generator 3, in particular in order to adjust the output impedance of the high frequency power generator 3 to the input impedance of the combination of the matching circuit 9 and plasma chamber 8. The second control arrangement 11 controls the matching circuit 9, in particular at least a reactance in the matching circuit 9. This can, for example, be a capacitor in the matching circuit 9. The second control arrangement 11 receives a measuring signal from the first measuring device 4 as an actual value. It is also possible for the second control arrangement 11 to receive a signal measured in the matching circuit 9 by means of a further measuring device 19 as a measuring signal, for example voltage, current, impedance and/or phase relation. The third measuring device 20 shown in FIGS. 1A to 1D and FIGS. 2A to 2D, however, is not intended to represent such a measuring device but rather a measuring device for detecting the adjustment of a reactance, which is adjusted by the control arrangement 11. This will be described in more detail in the description relating to FIGS. 1C and 2B.

The second control arrangement 11 together with the matching circuit 9 and the further measuring device 19 can be accommodated in a housing, in particular in a metallic housing. The matching circuit 9 can be designed so as to be cooled by air or fluid.

In order to be able to supply high frequency power in a low-loss manner to a plasma discharge in the plasma chamber 8, the output impedance of the high frequency power generator 3 is matched to the input impedance of the combination of plasma discharge and matching circuit. In some embodiments, a first control arrangement 6 is provided and is connected to the first measuring device 4. A measured value is determined at the output of the high frequency power generator 3 by the first measuring device 4. For example, a power reflected by the plasma discharge in the plasma chamber 8 or a change in the reflected power is detected. In the process, the change in reflected power can be the change via the frequency itself. The frequency can be modulated to this end.

A first actual value 12 is supplied to a first control unit 13. The first control unit 13 is also supplied with a first target value 14 and a correction value 15.

Taking into account these variables, a first adjustment value 22 is generated by the first control unit 13 and is supplied to the high frequency power generator 3. A device 16 for determining the correction value is supplied with a control value 24 and a default value 17. In the process, the device 16 for determining the correction value and the first control unit 13 are designed such that, when the first adjustment value 22 deviates from the default value 17, the correction value 15 influences the first control unit 13 such that the first actual value 12 deviates from the first target value 14 in the adjusted state of the first control unit 13 when the control value 24 and the default value 17 differ.

In the embodiments in FIGS. 1A to 1D, the measured value of the first measuring device 4 is supplied to the first control unit 13 as the first actual value 12.

Figure 1B:
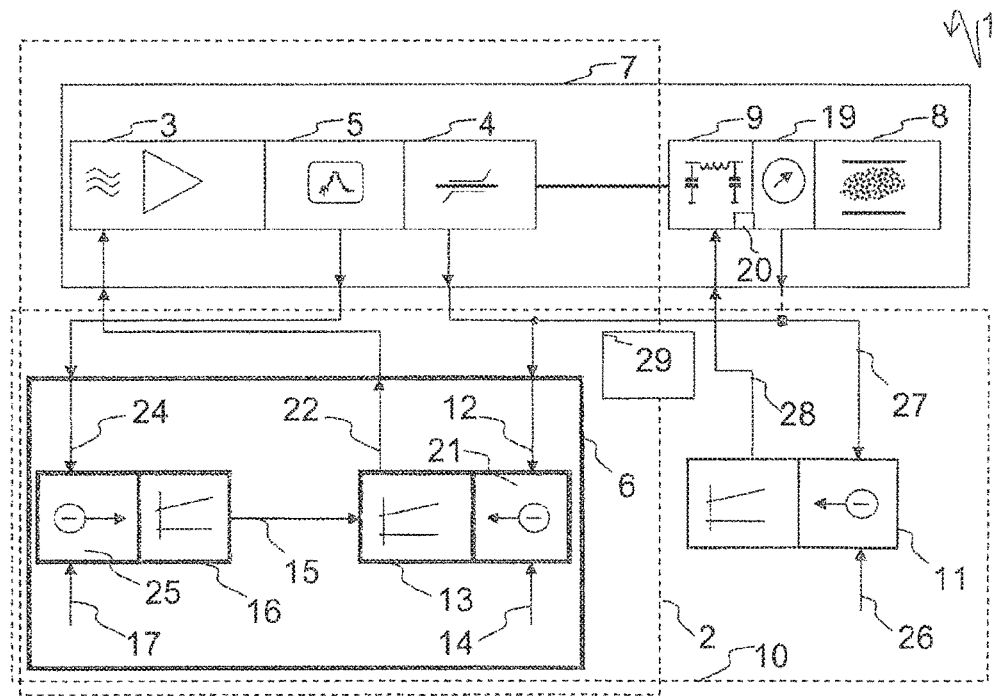

In the embodiment shown in FIGS. 1A and 1B, the control value 24 can be the frequency of the excitation signal of the high frequency power generator 3. Accordingly, the default value 17 can be a preferred frequency, in particular a desired fundamental frequency of the excitation signal and therefore of the high frequency power signal of the high frequency power generator 3.

In the embodiment shown in FIG. 1A, the control value 24 is the first adjustment value 22. In the embodiment shown in FIG. 1B, the control value 24 is the actual value measured by the second measuring device 5 of the variable adjusted by the first adjustment value 22, for example, the frequency of the high frequency power generator 3.

Therefore, owing to the first control arrangement 6, the frequency of the high frequency power generator 3 is not optimally tuned for impedance matching, but rather has a tendency towards the default value 17, that is to say towards the preferred frequency, for example, such that as a result of the intentional mismatch, the control of the matching circuit 9 has an incentive likewise to control. This can even lead to the control value 24, that is to say the current frequency, for example, again matching the default value 17, that is to say the preferred frequency, for example.

To control the matching circuit 9, a second control arrangement 11 can be provided, which is supplied with a second actual value 27, which can likewise be a reflected power and match the measured value determined by the first measuring device 4 or can be related thereto. It is also possible for the second control arrangement 11 to receive a signal measured in the matching circuit 9 as the second actual value 27, for example voltage, current, impedance and/or phase relation. However, for the sake of clarity this is not shown in the drawings.

Furthermore, the second control arrangement 11 can be supplied with a second target value 26. Depending on the second actual value 27 and the second target value 26, a second adjustment value 28 can be generated, which in turn is supplied to the matching circuit 9 in order, for example, to adjust a reactance there, in particular a capacitor, and improve the impedance matching as a result.

The first control unit 13 can comprise a device 21 for determining the control deviation which is supplied with the first actual value 12 and the first target value 14 and which is set up to determine a control deviation from the first actual value 12 and the first target value, which control deviation is taken into account in determining the first adjustment value 22. If a device 21 for determining the control deviation is provided, then a consensual control can be carried out. If no control deviation is determined, a consecutive control can be carried out, in which the control direction is determined by frequency steps using trial and error (better/worse matching). The frequency detuning away from the frequency for optimal matching towards the frequency defined by the default value 17 is carried out until a tolerable match is achieved for this frequency offset. The direction is defined from the increase in the matching curve defined by the step-by-step trials.

Figure 1C:
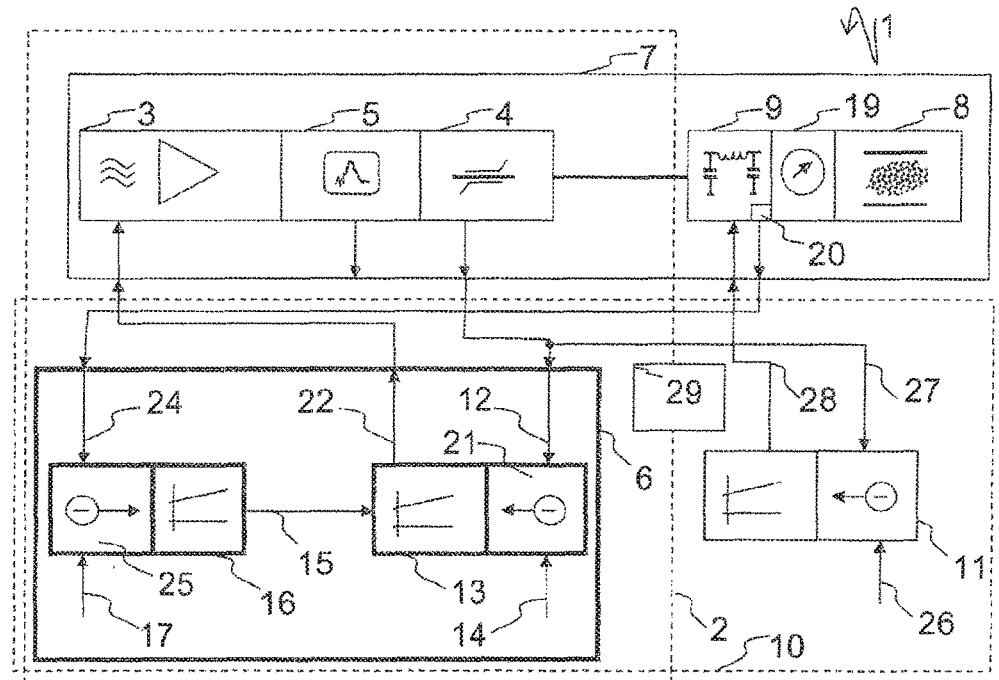
Figure 1D:
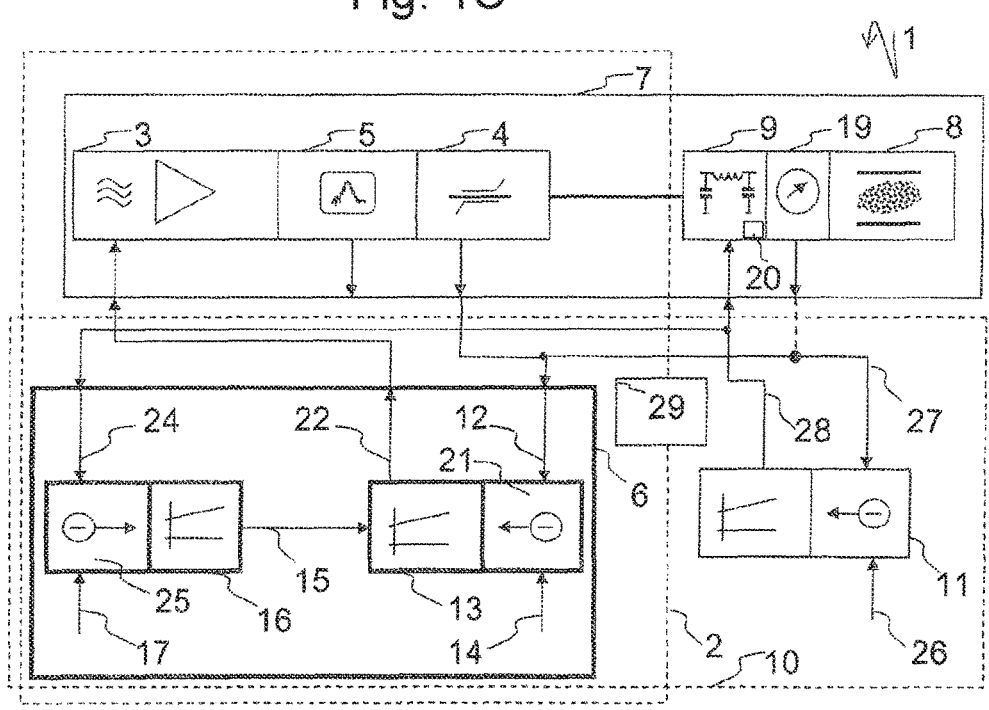

In the embodiment in FIG. 1C, the device 16 for determining the correction value is supplied with the adjustment of the component which is adjusted by the control arrangement 11, which is measured by the third measuring device 20, as the control value 24. This can, for example, be the adjustment of a component, in particular of a reactance, preferably of a capacitor, in the matching circuit 9. In the embodiment in FIG. 1D, the device 16 for determining the correction value is supplied with the second adjustment value 28 determined by the second control arrangement 11 for adjusting the component, which is adjusted by the control arrangement 11, as the control value 24. This can, for example, be the adjustment of a component, in particular a reactance, preferably a capacitor, in the matching circuit 9. In the case of the embodiments in FIGS. 1C and 1D, the default value 17 is a preferred value or value range for the adjustment of this component.

The embodiments in FIGS. 2A to 2D are a further schematic view of a plasma excitation system 1. In these embodiments, the first control arrangement 6 is assigned to the matching circuit 9, while the second control arrangement 11 is assigned to the high frequency power generator 3. The elements in FIGS. 2A to 2D corresponding to those in FIGS. 1A to 1D have the same reference numerals.

In the embodiments shown in FIG. 2A to 2D, in turn a reflected power or the change in reflected power is detected in the measuring device 4 and used as the first actual value 12. It is also possible, and also more usual, for a signal, for example voltage, current, impedance and/or phase relation, measured in the matching circuit 9 to be detected and used as the first actual value 12 by means of a further measuring device 19.

For example, the adjustment of a component, in particular of a reactance, preferably of a capacitor, in the matching circuit 9 is determined as the first adjustment value 22.

In the embodiments in FIG. 2A to 2D, the second control arrangement 11 controls the frequency of the high frequency power generator 3. For this purpose, a measured value detected by the first measuring device 4 and related to the reflected power is pre-determined for said control arrangement as the second actual value 27. For example, reflected power equal to 0 (zero) is pre-determined for said control arrangement as the target value 26. Said control arrangement determines a frequency default (adjustment value) for the high frequency power generator 3 as the second adjustment value 28.

Figure 2A:
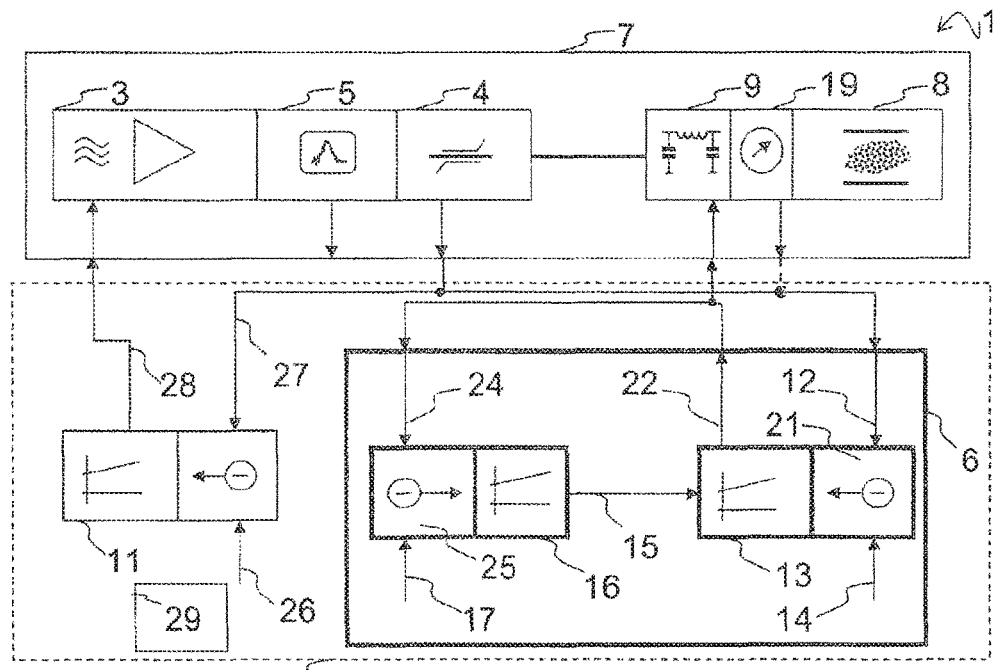
FIGS. 2A, 2B, 2C, and 2D depict embodiments of a plasma excitation system shown schematically.

In the embodiment in FIG. 2A, the device 16 for determining the correction value is supplied with the first adjustment value 22 which is determined by the first control arrangement 6, for adjusting the component which is adjusted by the control arrangement 6, as the control value 24. This can, for example, be the adjustment of a component, in particular of a reactance, preferably of a capacitor, in the matching circuit 9.

Figure 2B:
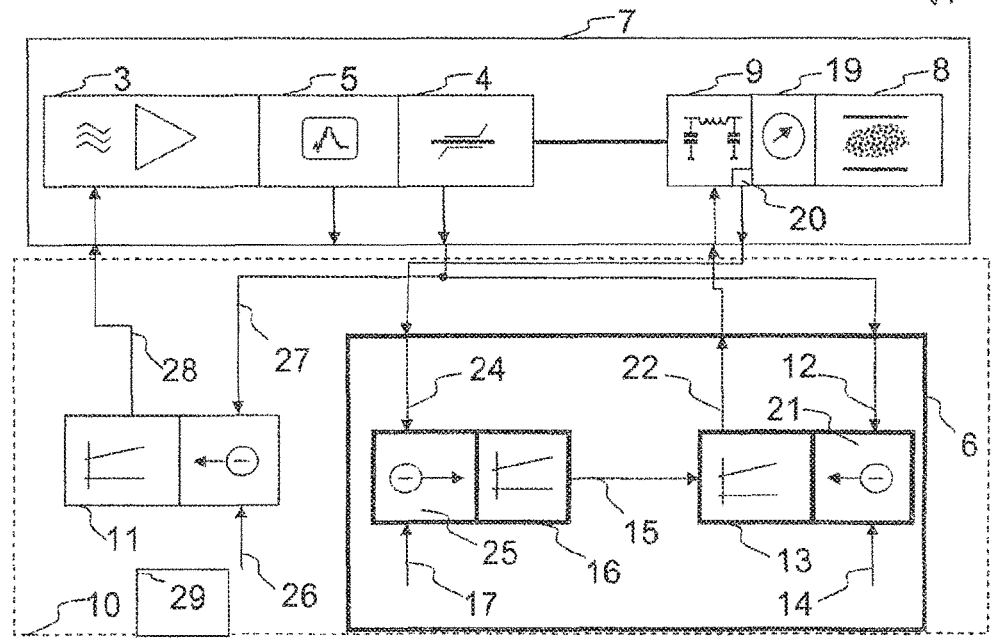

In the embodiment in FIG. 2B, the device 16 for determining the correction value is supplied with the adjustment of the component, which is adjusted by the control arrangement 11 and is determined by the third measurement device 20, as the control value 24. This can, for example, be the adjustment of a component, in particular of a reactance, preferably of a capacitor, in the matching circuit 9. In the embodiments in FIGS. 2A and 2B, the default value 17 is a preferred value or value range for the adjustment of this component.

Figure 2C:
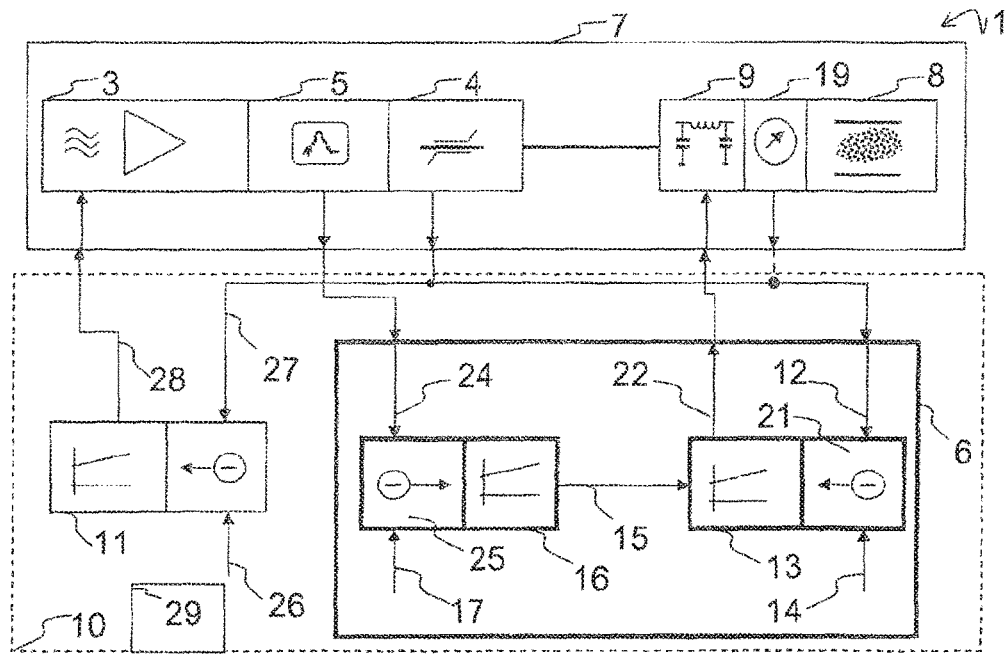
Figure 2D:
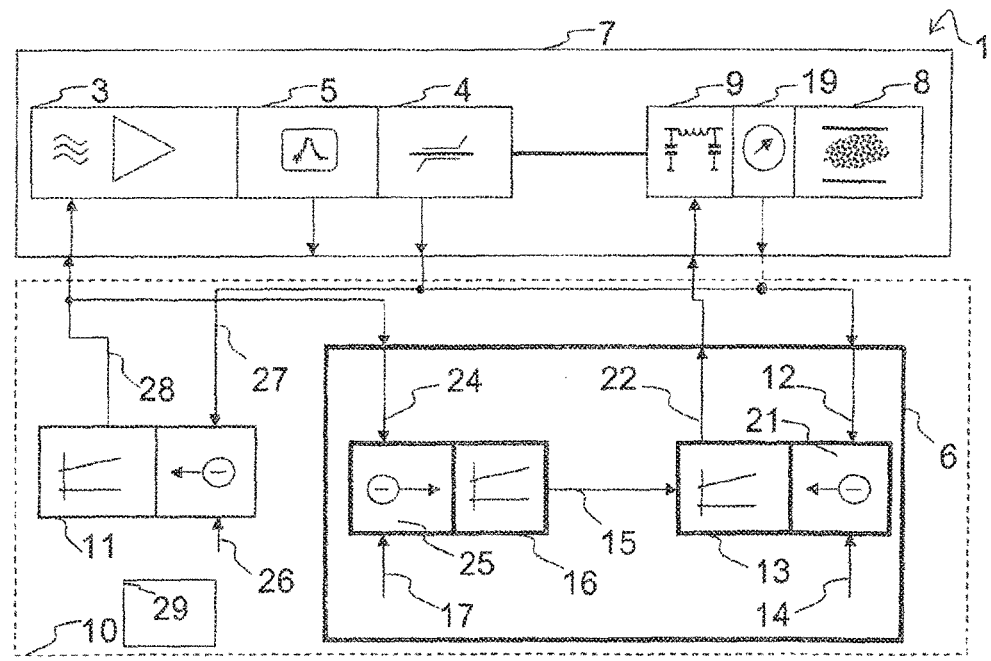

In the embodiments in FIGS. 2C to 2D, the control value 24 is supplied according to the measured frequency or the adjustment value for the same. Accordingly, the default value 17 can be a preferred frequency or frequency range, in particular a desired fundamental frequency of the excitation signal and therefore of the high frequency power signal of the high frequency power generator 3.

In the embodiments in FIGS. 1A to 2D, a control means 29 is provided, which controls the device 16 for determining the correction value and/or the first control unit 13. For example, the control means 29 can intervene in order to bring a frequency deviation from a desired fundamental frequency into a desired range. The control means 29 can be part of the high frequency generating device 2. The control means 29 can be arranged outside of the high frequency generating device 2. The control means 29 can be part of the control system 10. The control means 29 can be arranged outside of the control system 10. The control means can be a control means as described in the embodiment in FIG. 7.

Figure 3:
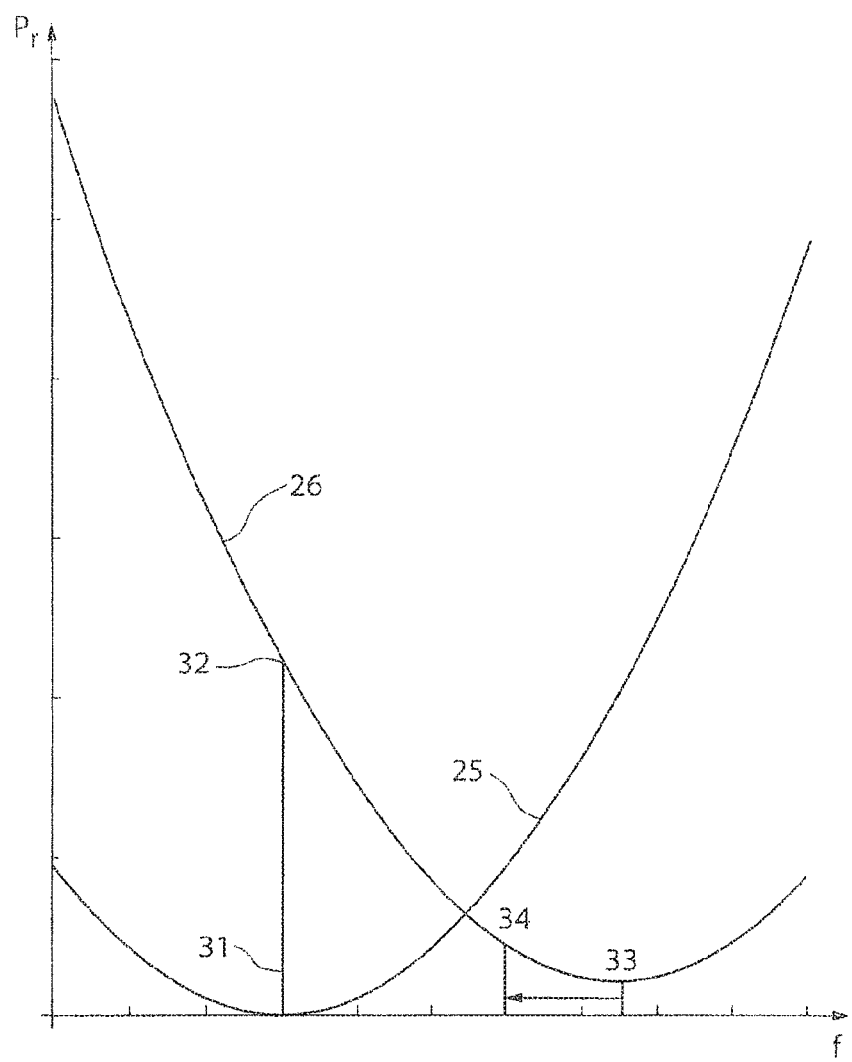
FIG. 3 is a diagram to show the effect of one or more embodiments.

FIG. 3 describes the effect of various embodiments described herein. The frequency is plotted on the horizontal axis, a frequency range from 13.1 to 14.2 MHz being recorded here. The vertical axis corresponds to the reflected power $P_r$ or to a signal that is proportional thereto. The curve 25 shows the power reflected on a load, for example a plasma discharge, during a change in frequency. The preferred frequency, the default value 17, for example 13.56 MHz in the embodiment, is located at the position 31. At this point, no reflected power occurs with optimal matching. If, however, the load at the high frequency power generator 3, e.g., the impedance of the plasma discharge, now changes, the curve 25 displaces to the curve 26. The frequency initially remains unchanged. For this reason, the reflected power increases at the point 32. The frequency control now conventionally controls the point 33 without the consideration of the correction value 15. According to one or more embodiments, however, the correction initiates and so the frequency control controls at point 34 such that a reflected power occurs intentionally. This leads to the second control arrangement 11 being prompted to reset the matching circuit 9.

The first control unit can be constructed in different ways. For example, the first control unit can comprise a PI controller or a PID controller. The integrator of the PI controller or of the PID controller can be constructed in different ways. Different embodiments of integrators are shown in FIGS. 4 to 6.

Figure 4:
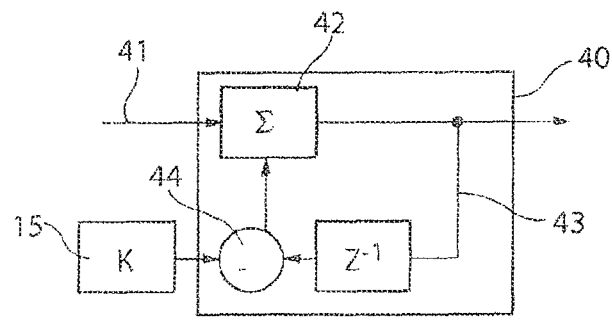
FIG. 4 depicts a first embodiment of an integrator.

FIG. 4 shows an integrator 40, to which a control deviation is supplied at the point 41. A feedback loop 43 adjoins a summing unit 42, in which feedback loop an adder 44 is provided where the integral component is added to the correction value 15. In the process, the correction value can be equal to 0 if the determined actual frequency matches the specified frequency. For other frequencies, the correction value can be <0 or >0.

Figure 5:
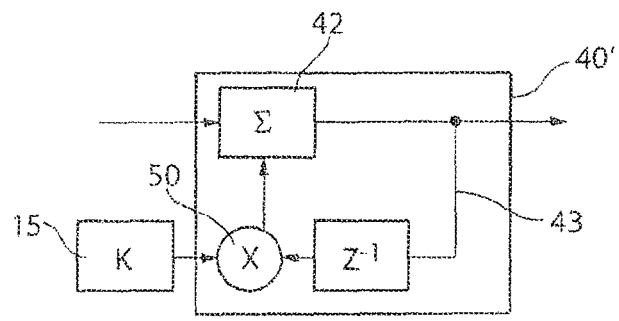
FIG. 5 depicts a second embodiment of an integrator.

A further embodiment of an integrator 40' is shown in FIG. 5. In this case, a multiplier 50, where the correction value 15 is multiplied by the integral component, is provided in the feedback loop 43. The integrator is therefore constantly influenced such that the control towards the preferred frequency (default value) is preferred.

Figure 6:
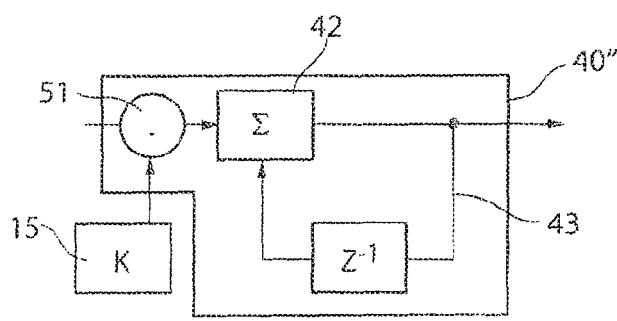
FIG. 6 depicts a third embodiment of an integrator.

In the case of the embodiment of an integrator 40" according to FIG. 6, an adder 51 is located upstream of the summing unit 42. Therefore, an addition to the correction value 15 is performed before the summing unit 42. A correction of the control deviation is therefore carried out. The correction value is preferably 0 for the preferred frequency and <0 and >0 for other frequencies.

The high frequency power generator 3 and the high frequency generating device 2 can each be accommodated in a housing, in particular in a metallic housing, and have electrical power supply connections. One or more assemblies can be arranged in both devices. Assemblies can be mounted on metallic base bodies and/or on circuit boards. Furthermore, ventilation connections can be provided for the circulation of air and cooling. Furthermore, the high frequency generating device 2 and the high frequency power generator 3 can have various connections such as coolant connections or connections for electrical connection to external components.

The first control arrangement 6, the control system 10, the second control arrangement 11 can be designed as analogue or in particular as digital control systems or control arrangements. For this purpose, the measuring signals are filtered, sampled and digitalized. A digital control system or control arrangement can be achieved inside a microprocessor, for example in a digital signal processor (DSP) or in a programmable logic device (PLD) in particular in an FPGA. In this manner, the control systems or arrangements can work particularly fast.

Figure 7:
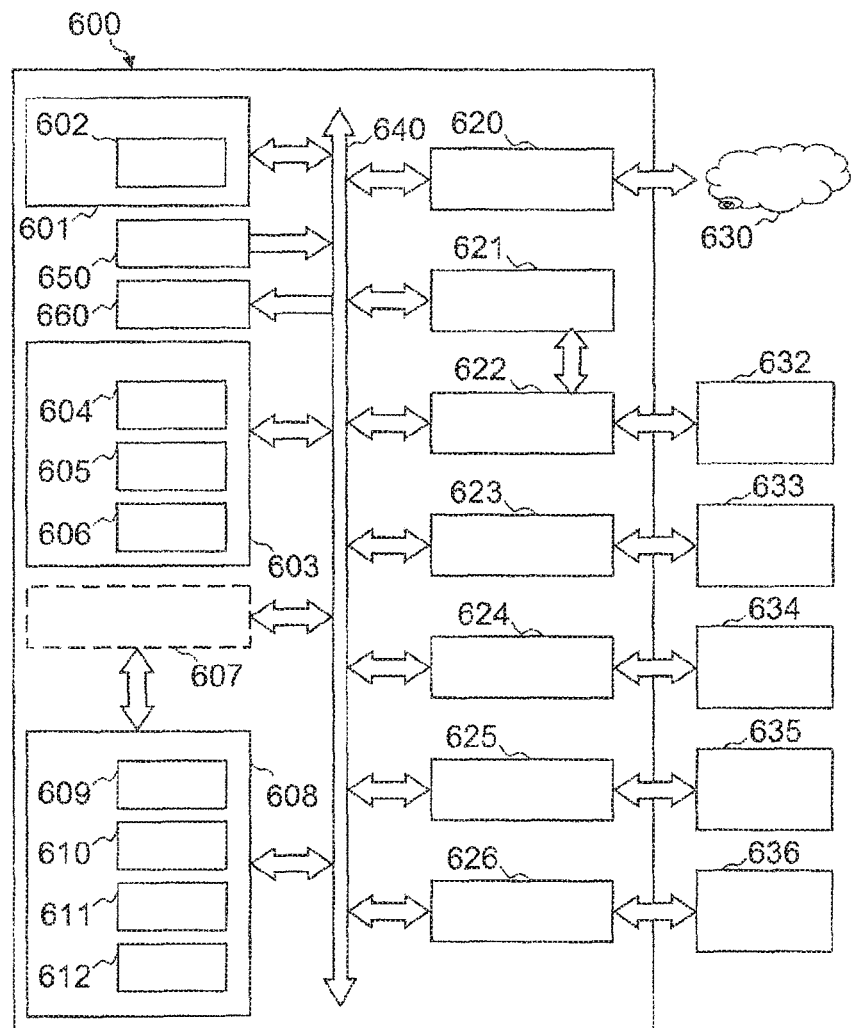
FIG. 7 depicts an embodiment of a control means.

FIG. 7 is a schematic view of an embodiment of a control system 600, which is suitable for carrying out instructions to carry out one or more aspects of the method in one of the devices according to one or more embodiments. For example, the control system 600 can be used to achieve the control means 29 from FIGS. 1A to 2D. The components in FIG. 7 are to be understood to be examples and do not limit the scope of the use or functionality of hardware, software, firmware, embedded logic components, or a combination of a plurality of such components for implementing specific embodiments. Some or all of the components shown can be part of the control system 600.

In this embodiment, the control system 600 contains at least one processor 601, such as a central processing unit (CPU, DSP) or a programmable logic device (PLD, FPGA). The control system 600 can also comprise a working memory 603 and a data memory 608, which both communicate with each other and with other components via a bus 640. The bus 640 can also connect a display 632, one or more input devices 633, one or more output devices 634, one or more memory devices 635 and various storage media 636 to one another and to one or more devices of the processor 601, the working memory 603 and the data memory 608. All of these elements can be coupled directly or via one or more interfaces 622, 623, 624, 625, 626 or adapters to the bus 640.

The control system 600 can have any suitable physical form, including but not limited to, one or more integrated circuits (ICs), printed circuit boards (PCBs), mobile handsets, laptop or notebook computers, distributed computer systems, computational grids or servers. The processor 601 or a central processing unit (CPU) contains a cache memory unit 602, if applicable, for the temporary local storage of commands, data or processor addresses. The processor 601 is configured to assist with carrying out instructions which are stored on at least one storage medium.

The memory 603 can comprise various components including, but not to be limited to, a random access memory component, for example RAM 604, in particular a static RAM (SRAM), a dynamic RAM (DRAM), etc., a read-only component, for example ROM 605, and any desired combinations thereof. The ROM 605 can also function to communicate data and instructions unidirectionally to the processor or processors 601 and the RAM 604 can also function to communicate data and instructions bidirectionally to the processor or processors 601.

The read-only memory 608 is connected bidirectionally to the processor or processors 601, optionally by means of a memory control unit 607. The read-only memory 608 provides additional memory capacity. The memory 608 can be used to store the operating system 609, programs 610, data 611, applications 612, application programs and similar. Frequently, but not always, the memory 608 is a secondary storage medium (such as a hard disk), which is slower than the primary memory (for example the memory 603). The memory 608 can, for example, also comprise a magnetic, optical or transistorized, a solid state memory device (for example flash-based systems) or a combination of any of the aforementioned elements. The information memory 608 can be integrated into the memory 603 as a virtual memory in appropriate cases.

The bus 640 connects a large number of subsystems. The bus 640 can be any of a plurality of types of bus structure, for example a memory bus, a memory controller, a peripheral bus, a local bus and all combinations thereof, using a large number of bus architectures. Information and data can also be displayed via a display 632. Examples of a display 632 include, but are not limited to, a liquid crystal display (LCD), an organic liquid crystal display (OLED), a cathode ray tube (CRT), a plasma display and any combination thereof. The display 632 can be connected to a processor (processors) 601, memories 603, 608, input devices 633, and other components via the bus 640.

The bus 640 can connect all of the aforementioned components to an external network 630 using a network interface 620. This can be for example a LAN, WLAN, etc. It can establish a connection to further memory media, servers, printers, display devices. It can have access to telecommunications devices and the internet. The bus 640 can connect all of the aforementioned components to a graphics controller 621 and a graphics interface 622, which can be connected to at least one input device 633.

The bus 640 can connect all of the aforementioned components to an input interface 623, which can be connected to at least one input device 633. An input device can include for example a keypad, a keyboard, a mouse, a stylus, a touchscreen, etc.

The bus 640 can connect all of the aforementioned components to an output interface 624, which can be connected to at least one output device 634. An output device 634 can have a light display, an LED display, a display, for example an LCD, OLED, etc. or an interface to such a device.

The bus 640 can connect all of the aforementioned components to a memory access interface 625, which can be connected to at least one memory device 635. The bus 640 can connect all of the aforementioned components to a further memory access interface 626, which can be connected to at least one memory medium 636. A memory device 635 or a memory medium 636 can, for example, be a solid state, magnetic or optical memory, in particular can comprise a non-volatile memory. The memory medium can be separated from the control system when the control system is operating, without the data being lost.

The display 632, input device 633, output device 634, memory device 635, storage medium 636 can each be arranged outside of the control system 600 or be integrated therein. They can also be connected to the control system 600 via a connection to the internet or other network interfaces.

A number of embodiments of the invention have been described. Nevertheless, it will be understood that various modifications may be made without departing from the spirit and scope of the invention. Accordingly, other embodiments are within the scope of the following claims.

What is claimed is:

1. A plasma discharge control system comprising:
a first control unit to which a first target value, a first actual value, and a correction value are supplied, wherein the first control unit is configured to generate a first adjustment value by taking into account the correction value, the first target value, and the first actual value; and
a first value determinator configured to determine the correction value, to which first value determinator a control value is supplied, the first value determinator being configured to determine the correction value by taking into account the control value and a default value, the first value determinator being coupled to the first control unit and configured to supply the correction value to the first control unit,
wherein the first value determinator and the first control unit are configured such that, when the control value deviates from the default value, the correction value influences the first control unit such that the first actual value deviates from the first target value in an adjusted state of the first control unit.

2. The plasma discharge control system according to claim 1, wherein the first value determinator is further configured to determine the correction value such that a deviation of the control value from the default value is reduced.

3. The plasma discharge control system according to claim 1, wherein the first control unit comprises an integrator, the correction value being added to or multiplied by an integral component of the integrator.

4. The plasma discharge control system according to claim 3, wherein the integrator is a digital integrator.

5. The plasma discharge control system according to claim 1, wherein the correction value is a function of the deviation from both the default value and the control value.

6. The plasma discharge control system according to claim 5, wherein the function is a linear or quadratic function.

7. The plasma discharge control system according to claim 1, wherein the first value determinator is a second control unit, the correction value being a further adjustment value.

8. The plasma discharge control system according to claim 1, further comprising:
a second value determinator which is supplied with the first actual value or an actual variable related thereto, wherein the second value determinator is configured to generate a second adjustment value.

9. A high frequency generating system comprising:
a high frequency power generator;
a measuring sensor configured to determine a first actual value;
a first control unit to which a first target value, the first actual value, and a correction value are supplied, wherein the first control unit is configured to generate a first adjustment value by taking into account the correction value, the first actual value, and the first target value; and
a first value determinator configured to determine the correction value, to which first value determinator a control value is supplied, the first value determinator being configured to determine the correction value by taking into account the control value and a default value, the first value determinator being coupled to the first control unit and configured to supply the correction value to the first control unit,
wherein the first value determinator and the first control unit are configured such that, when the control value deviates from the default value, the correction value influences the first control unit such that the first actual value deviates from the first target value in an adjusted state of the first control unit.

10. The high frequency generating system according to claim 9, wherein the first actual value influences a frequency of the high frequency power generator.

11. The high frequency generating system according to claim 9, further comprising:
a second value determinator which is supplied with the first actual value or an actual variable related thereto, wherein the second value determinator is configured to generate a second adjustment value.

12. The high frequency generating system of claim 9, wherein the control value is a frequency of an excitation signal of the high frequency power generator, and the default value is a desired fundamental frequency of the excitation signal.

13. A plasma excitation system comprising:
a high frequency power generator;
a plasma discharge, which is connected to the high frequency power generator such that the plasma discharge can be supplied with power generated by the high frequency power generator;
a measuring sensor configured to determine a first actual value;
a first control unit to which a first target value, the first actual value, and a correction value are supplied, the first control unit being configured to generate a first adjustment value by taking into account the correction value, the first actual value, and the first target value; and
a first value determinator configured to determine the correction value, to which first value determinator a control value is supplied, the first value determinator being configured to determine the correction value by taking into account the control value and a default value, the first value determinator being coupled to the first control unit and supply the correction value to the first control unit, wherein the first value determinator and the first control unit are configured such that, when the control value deviates from the default value, the correction value influences the first control unit such that the first actual value deviates from the first target value in an adjusted state of the first control unit.

14. The high frequency generating system of claim 9, wherein the first adjustment value is supplied to the high frequency power generator, such that the first actual value associated with the high frequency power generator is affected by the first adjustment value.

15. The high frequency generating system of claim 9, wherein the control value is the first adjustment value.

16. The high frequency generating system of claim 9, wherein the control value is a second actual value of a variable adjusted by the first adjustment value.

17. The high frequency generating system of claim 9, wherein the first control unit is configured to:
determine a control deviation of the first actual value from the first target value, and
determine the first adjustment value by taking into account of the control deviation.

18. The plasma excitation system according to claim 13, further comprising:
a second value determinator which is supplied with the first actual value or an actual variable related thereto, wherein the second value determinator is configured to generate a second adjustment value.

19. A method for plasma discharge control, the method comprising:
generating a first adjustment value of a first control unit from a first target value, a first actual value, and a correction value; and
determining the correction value from a control value associated with the first adjustment value and a default value, the correction value being supplied to the first control unit,
wherein the correction value is generated such that, when the control value deviates from the default value, the first actual value deviates from the first target value in an adjusted state of the first control unit.

20. The method according to claim 19, wherein generating the first adjustment value and determining the correction value are performed by a first control arrangement, and wherein a second actual value or a value related thereto is controlled by a second control arrangement.

* * * * *